US005548483A

United States Patent [19]

Feldman

[11] Patent Number: 5,548,483
[45] Date of Patent: Aug. 20, 1996

[54] FRAMELESS IC CARD AND HOUSING THEREFOR

[75] Inventor: Steven Feldman, Huntingdon, Pa.

[73] Assignee: Elco Corporation, Huntingdon, Pa.

[21] Appl. No.: 377,314

[22] Filed: Jan. 24, 1995

[51] Int. Cl.⁶ ...................................................... H05K 1/14
[52] U.S. Cl. .......................... 361/737; 361/752; 361/759; 361/798; 235/88 R; 439/76.1
[58] Field of Search ..................................... 361/228, 737, 361/752, 759, 796, 798; 174/52.1–52.3; 206/328, 449, 39, 329; 220/4.01, 4.02; 235/492, 487, 88; 439/76, 77, 152–153, 492–499; 257/678, 679, 730; 364/708

[56]  References Cited

U.S. PATENT DOCUMENTS

| 4,695,925 | 9/1987  | Kodai et al. ........................... 361/395 |
| 4,912,602 | 3/1990  | Zurek et al. . |
| 5,005,106 | 4/1991  | Kiku ..................................... 361/424 |
| 5,061,845 | 10/1991 | Pinnavaia ............................. 235/492 |
| 5,107,073 | 4/1992  | Steffen ................................. 174/52.1 |
| 5,124,888 | 6/1992  | Suzuki et al. . |
| 5,144,533 | 9/1992  | Annett . |
| 5,153,818 | 10/1992 | Mukougawa et al. . |
| 5,207,342 | 5/1993  | Tsuji et al. . |
| 5,207,586 | 5/1993  | MacGregor et al. . |
| 5,210,442 | 5/1993  | Ishimoto . |
| 5,242,310 | 9/1993  | Leung . |
| 5,319,516 | 6/1994  | Perkins . |
| 5,330,360 | 7/1994  | Marsh et al. . |
| 5,339,222 | 8/1994  | Simmons et al. . |

Primary Examiner—Leo P. Picard
Assistant Examiner—Y. Whang
Attorney, Agent, or Firm—Loeb & Loeb LLP

[57]  ABSTRACT

An improved IC card construction eliminates the need for a frame thereby increasing the space available within the IC card and the available substrate or PCB surface area making possible the use of additional integrated circuits or other electronic components. The frameless IC card of the invention includes a housing comprising top and bottom covers having interconnected longitudinal side margins providing a rigid IC card housing structure.

31 Claims, 17 Drawing Sheets

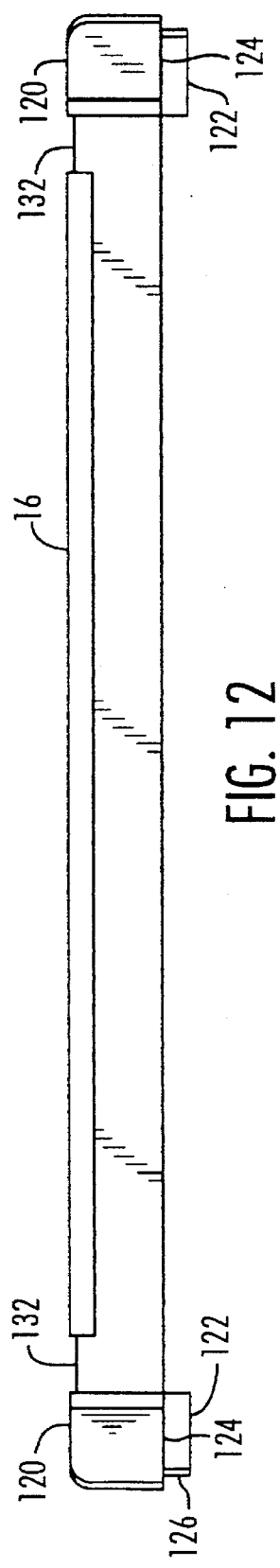
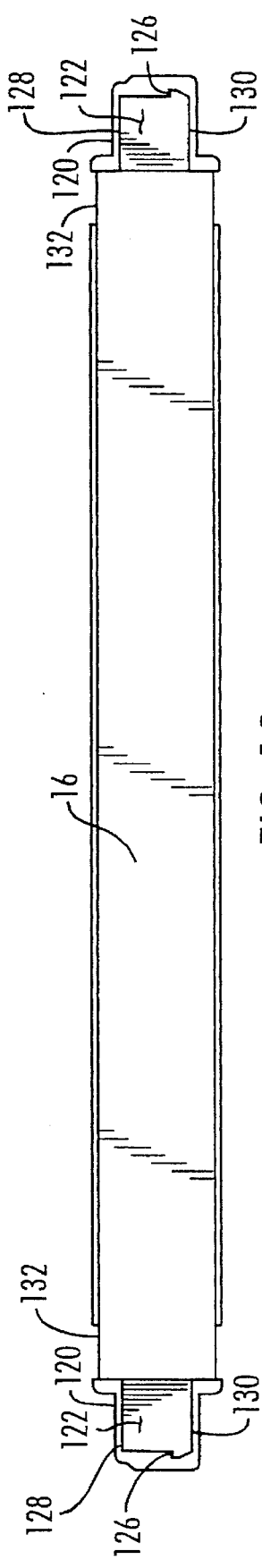

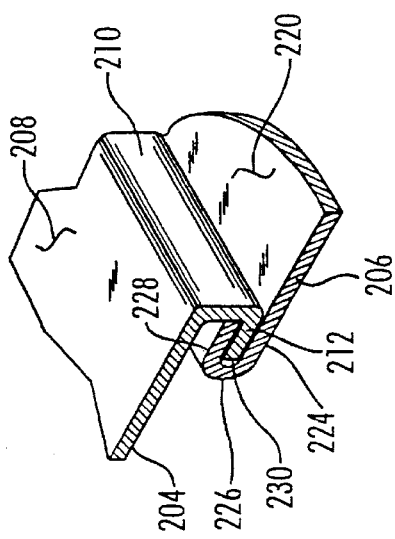
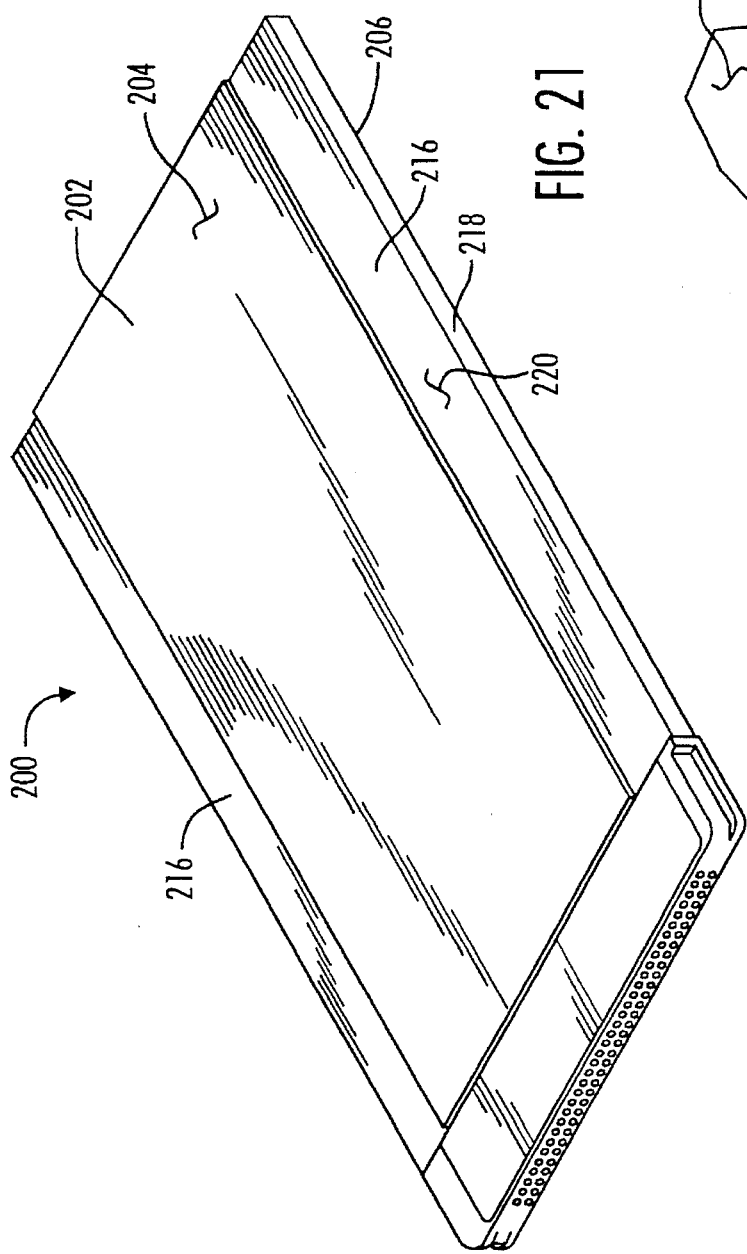

FRAMELESS IC CARD AND HOUSING THEREFOR

FIELD OF THE INVENTION

This invention relates generally to removable IC cards of the type used with personal computers, peripherals and other electronic apparatus, and particularly to improved IC card housing constructions eliminating the frame heretofore employed, thereby increasing the usable substrate surface area within the IC card.

BACKGROUND OF THE INVENTION

Many of today's laptop, notebook, desktop and other personal computers, as well as computer peripherals and other electronic products have receptacles or ports for receiving removable IC cards. Such cards typically conform to software and hardware specifications, including form factor standards, established by the Personal Computer Memory Card International Association (PCMCIA). IC cards may be used for various purposes: for example, they can supplement the semiconductor or disk memory of a personal computer, or can be used as a communications link or to store information or data for use by the host system or for reconfiguring the host system in response to information stored in the integrated circuits within the IC card.

A typical IC card, along the lines disclosed in U.S. Pat. Nos. 5,244,397; 5,319,516; 5,038,250; 5,242,310 and 5,196,994, is built around a rectangular, molded plastic frame for supporting and locating a substrate or printed circuit board (PCB) carrying integrated circuit packages. The frame may include one or more cross ribs providing additional strength as well as PCB support and locating surfaces. The frame protects the PCB assembly from mechanical damage and serves as an attachment means for the housing connectors, switches, battery holders, and so forth. A bus connector is typically attached to the forward edge of the PCB. The bus connector includes a connector block of molded plastic enclosing multiple contacts for electrically connecting the IC card circuit elements to the host system by way of the IC card port. Some IC cards include along the rear edge of the PCB an input/output (I/O) connector for receiving a communications cable harness. Like the bus connector block, the rear I/O connector is connected to circuit elements on the substrate.

IC cards of the prior art further include a housing or cover usually comprising a pair of opposed sheet metal panels mechanically or adhesively secured to the plastic frame and in some cases, to the bus and rear connector bodies as well.

A drawback of conventional IC cards is that the frame occupies a significant portion of the space within the card thereby limiting the usable area available for the substrate. Because IC cards must conform to established PCMCIA form factors (for example, 85×54×5 mm for Type I cards), the external package dimensions cannot be expanded to provide additional substrate area.

Accordingly, an overall object of the present invention is to increase the usable substrate area of a standard IC card in order to accommodate additional IC packages and other electronic components, and to do so without sacrificing the mechanical strength and structural integrity of the IC card.

SUMMARY OF THE INVENTION

The overall object of the present invention is achieved by providing an improved IC card housing construction which eliminates the need for a frame thereby increasing the space available within the IC card and therefore the available substrate or PCB surface area making possible the use of additional integrated circuits or other electronic components. For example, in accordance with one practical form of a frameless IC card pursuant to the invention which incorporates a double-sided PCB having a length of 2.85 inches (72.4 mm), the increased usable PCB area is about 2.2 square inches and trace placement area is increased by about 1.65 square inches. By eliminating the frame and by directly attaching the bus connector and rear end piece to the covers results in an efficient structure, reducing the cost of the IC card by reducing the number of assembly steps and the component count.

More specifically, the overall object of the present invention is achieved by employing top and bottom housing covers having pairs of corresponding longitudinal side margins that are directly connected and so configured to provide a structurally rigid geometry. The corresponding longitudinal margins along at least one side of the frameless IC card housing are configured to interlock so as to facilitate assembly of the frameless IC card yet provide a strong interlocked joint in the final assembly. In one embodiment of a frameless IC card according to the invention, the IC card housing comprises separate top and bottom covers, each cover including parallel longitudinal side margins and the corresponding longitudinal side margins of the top and bottom covers being secured to each other by interlocking, latching fastener elements. Further in this embodiment, the top and bottom covers have corresponding forward edge margins attached to each other by interlocking, latching fastener elements. The bus connector is configured to receive these fastener elements and to be secured in place thereby. Still further, the bus connector and the fastener elements on the forward margin of the bottom cover are so configured that the fastener elements on the forward margin of the bottom cover can accurately locate and fixture the bus connector relative to the PCB for soldering the contact fingers of the bus connect to the PCB during assembly of the card. Moreover, in this embodiment, where the rear end piece is in the form of an I/O connector, that connector can be similarly fixtured by the bottom cover for soldering to the PCB.

Thus, the frameless IC card housing construction of this embodiment facilitates a rapid, bottom-up assembly of the card. In this regard, provision can be made to locate the substrate or PCB at a desired height within the housing and the bus connector block and rear end piece can be snapped in place in the bottom cover so that they are conveniently fixtured by the lower cover for soldering. Following soldering, the top cover is latched in place, completing the assembly.

In accordance with another embodiment of the frameless IC card of the invention, the housing may be formed from a single piece of sheet metal folded over along a central longitudinally extending area or bridge portion thereby defining opposing top and bottom covers. Each cover includes a longitudinally extending edge margin, the edge margins of the top and bottom covers being in alignment and including interlocking fastener elements for securely joining the edge margins.

In accordance with yet another embodiment of the frameless IC card of the present invention, there is provided a card housing comprising separate top and bottom covers having corresponding longitudinal side margins including complementary, longitudinally extending, interlocking flanges and grooves. In this embodiment, the longitudinal flanges on one of the covers are slidably received by the longitudinal grooves defined by the other cover.

With the housing construction and joinder in accordance with the invention, strength and rigidity of the final IC card assembly can be made greater than that achieved by present metal-to-plastic snap or adhesive assembly to thereby provide better protection for the internal components.

In accordance with other features of the invention, the IC card can be provided with a variety of alternative modular rear end pieces serving various functions, for example, as an I/O connector, switch mount or battery holder.

BRIEF DESCRIPTION OF THE DRAWINGS

Further objects, features and advantages of the invention will become evident from the detailed description below when read in conjunction with the accompanying drawings in which:

FIG. 12 is a top plan view of a rear end cap that may be incorporated in a frameless IC card of the invention;

FIG. 13 is a front elevation view of the rear end cap of FIG. 12;

FIG. 21 is a perspective view of a frameless IC card pursuant to a fourth embodiment of the invention;

FIG. 22 is a cross section view along line 22—22 in FIG. 21;

DETAILED DESCRIPTION OF THE PREFERRED EMBODIMENTS

Figure 1:
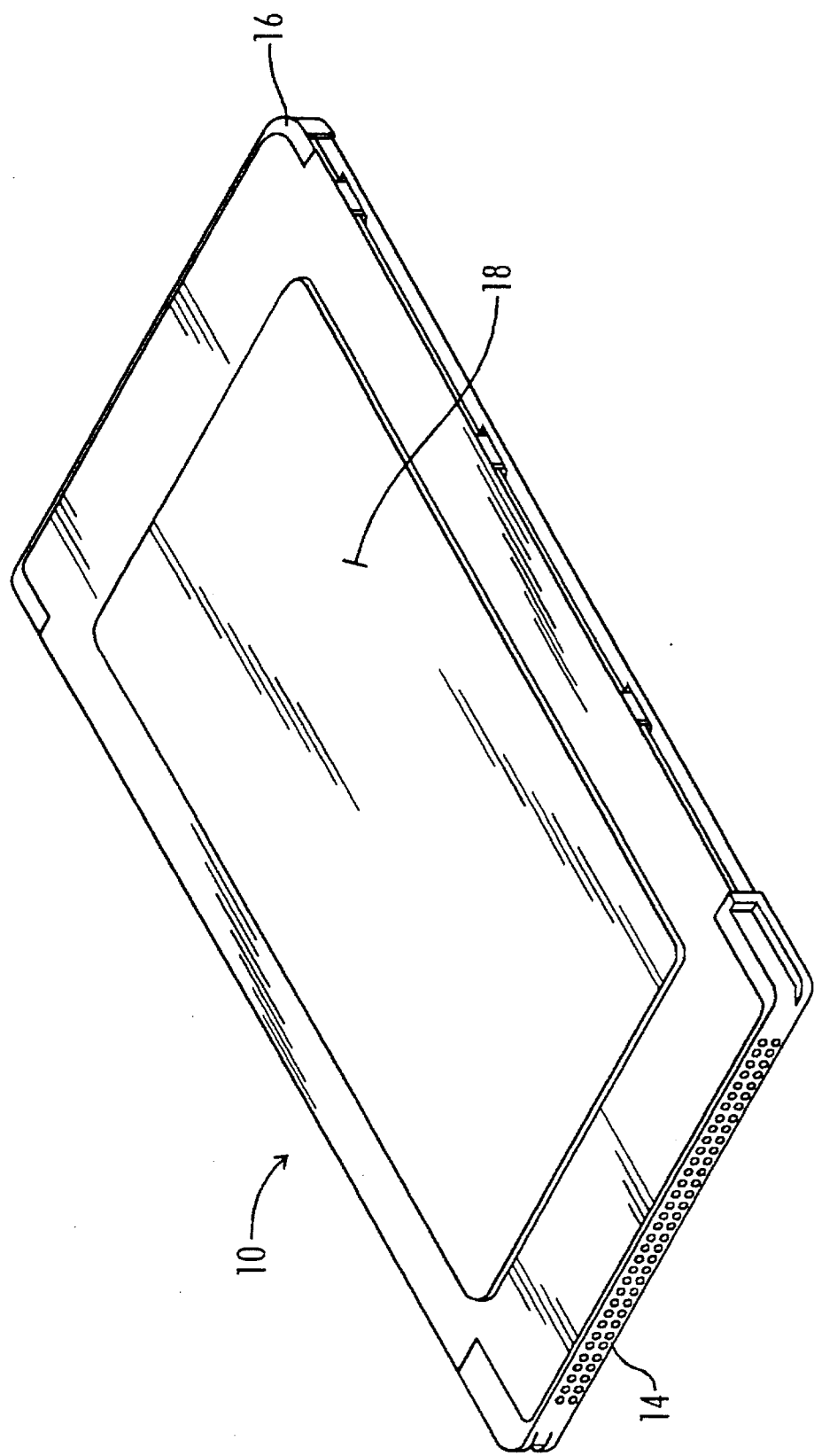
FIG. 1 is a perspective view of a frameless IC card in accordance with the present invention.
Figure 2:
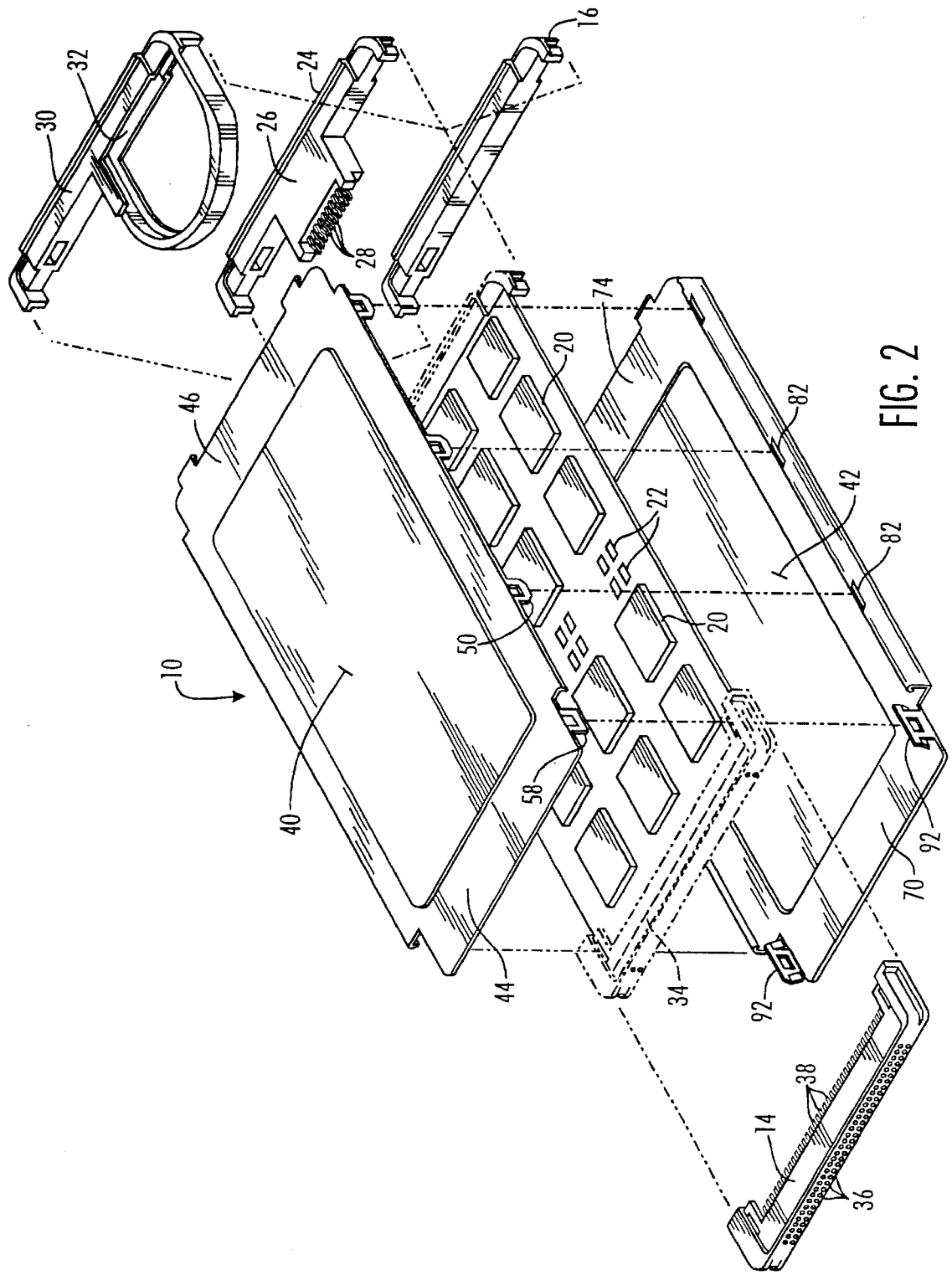
FIG. 2 is an exploded, perspective view of the IC card shown in FIG. 1.
Figure 3:
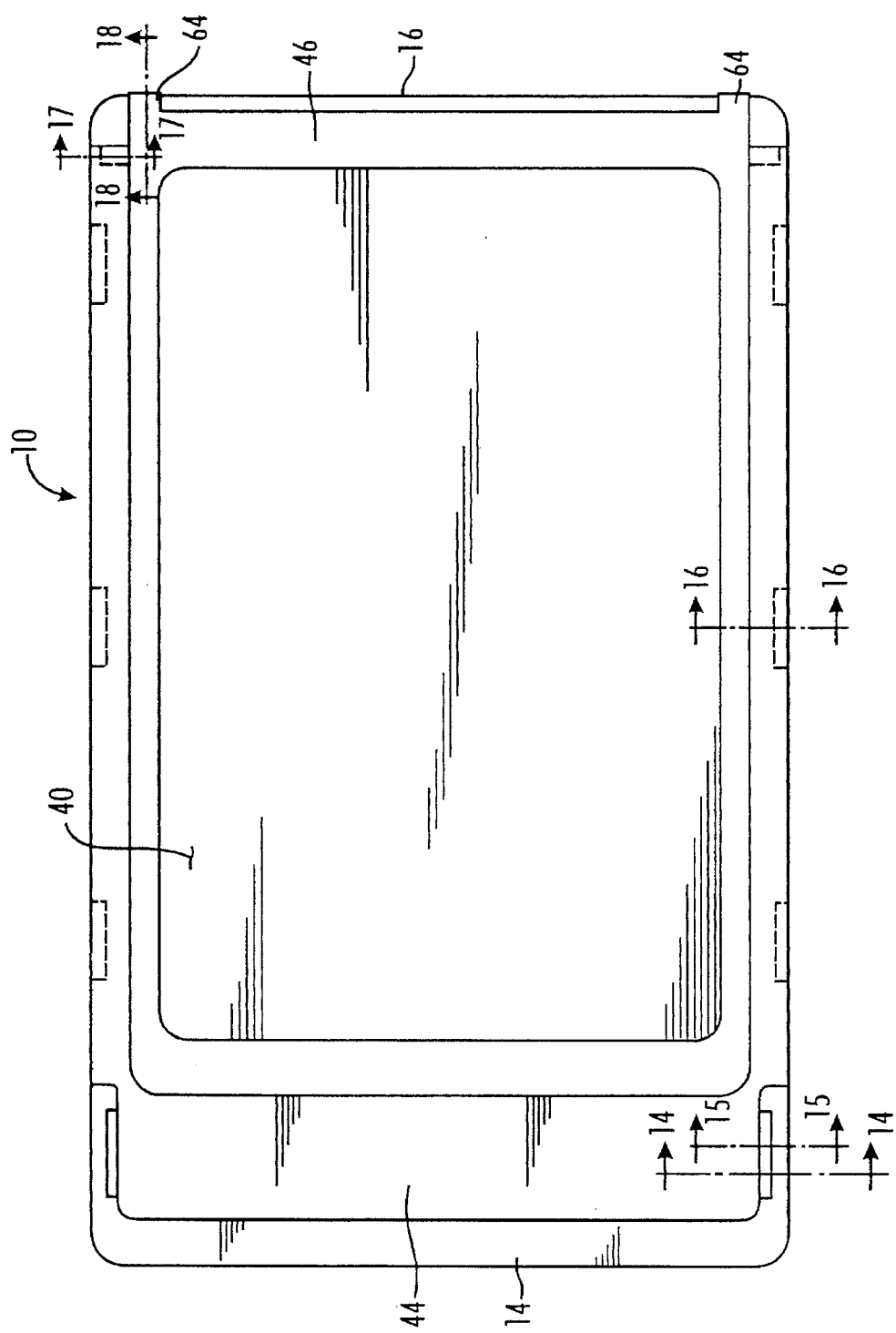
FIG. 3 is a top plan view of the IC card of FIG. 1.

It will be evident that in certain of the figures of the drawings, the thicknesses of sheet metal components have been exaggerated for the sake of clarity.

Referring to FIGS. 1–9 of the drawings, there is shown a frameless IC card 10 comprising generally a substrate in the form of a printed circuit board (PCB) 12, a multipole bus connector 14, an end piece in the form of an end cap 16 and a housing 18 for enclosing the PCB 12. In the specific embodiment under consideration, the PCB 12 carries a plurality of integrated circuit packages 20 and other electronic components 22, the nature and placement of which will be evident to skilled artisans. As already explained, the IC card 10 may interact with, and/or supplement the functions of, the host apparatus in a variety of ways depending upon the function of the card. For example, where the IC card serves as a communications link, it may be provided with a rear end piece in the form of an I/O rear connector module 24 in place of the end cap 16. The module 24 includes a connector body 26 having a port for receiving a communications cable (not shown). The connector body 26 includes contact fingers 28 adapted to be soldered to traces on the PCB 12 in a manner well known in the art.

As another alternative, the IC card can be provided with a rear end piece 30 including a battery box 32. As yet another alternative (not shown), the rear end piece can serve as a switch mount.

The PCB 12 has a forward edge 34 including a terminal section (not illustrated) comprising a plurality of conductive traces connected to the various IC packages and other electronic components carried by the PCB 12.

The bus connector 14 is a molded plastic structure having transverse rows of longitudinally extending apertures 36. As is well known, each aperture contains a contact adapted to be engaged by a male pin of a male connector (not shown) in the receiving port on the host apparatus. Each contact further has a rearwardly extending finger or terminal 38 soldered to one of the traces along the forward edge of the PCB 12.

The housing 18 is preferably fabricated of sheet metal such as stainless steel and includes generally parallel, opposed top and bottom covers 40 and 42, respectively. The top cover 40 (which is shown upside down in FIGS. 4–6 to show the details thereof) has a transverse forward edge margin 44, a transverse rear edge margin 46 and depending longitudinal side margins 48 extending generally vertically. Projecting vertically from each side margin are a plurality (three in the example shown) of fastener tabs 50 each of which has a generally rectangular opening 52.

Figure 4:
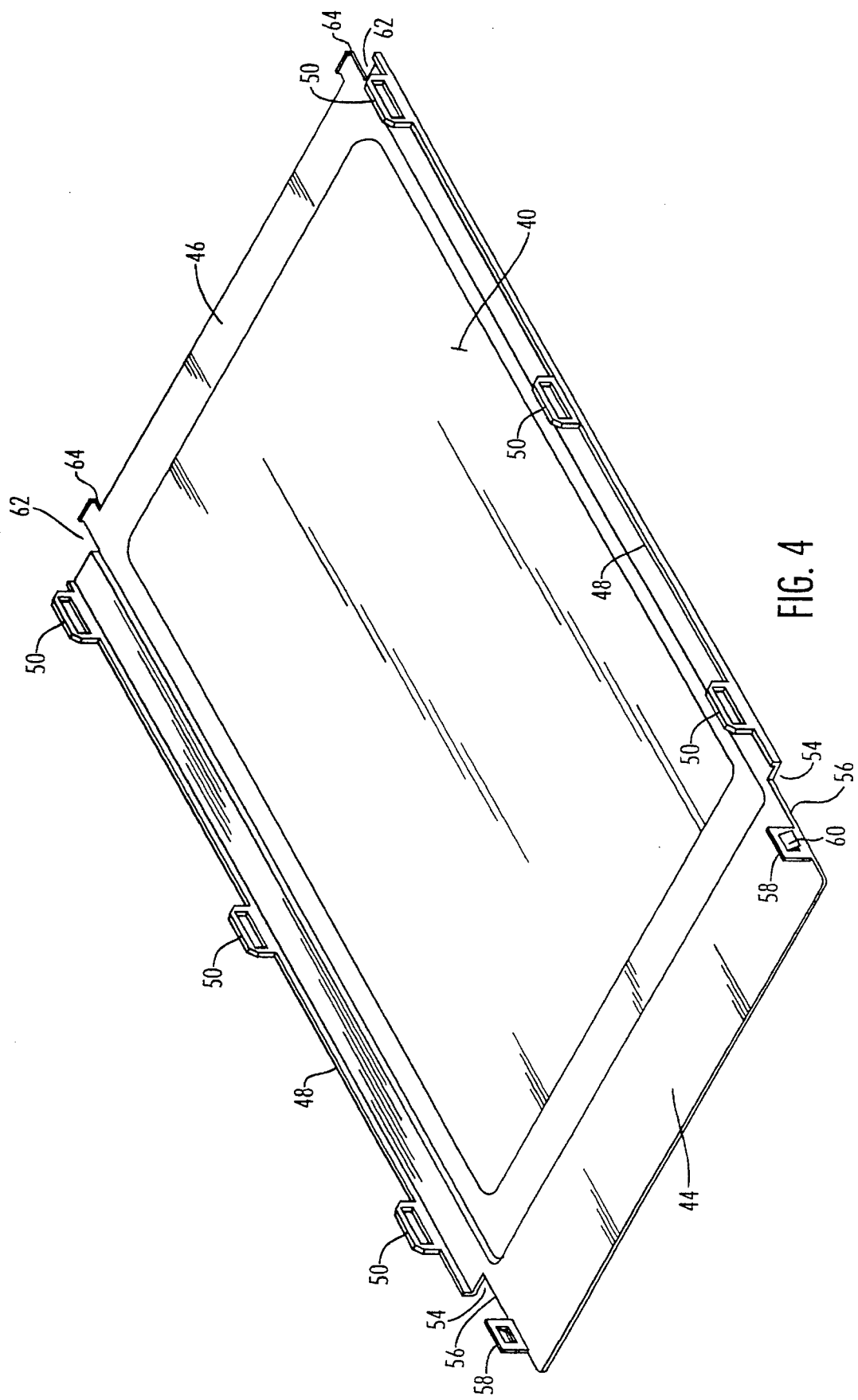
FIG. 4 is a perspective view of the top housing cover of the frameless IC card of FIG. 1 with the cover shown upside down to better illustrate certain features.
Figure 6:
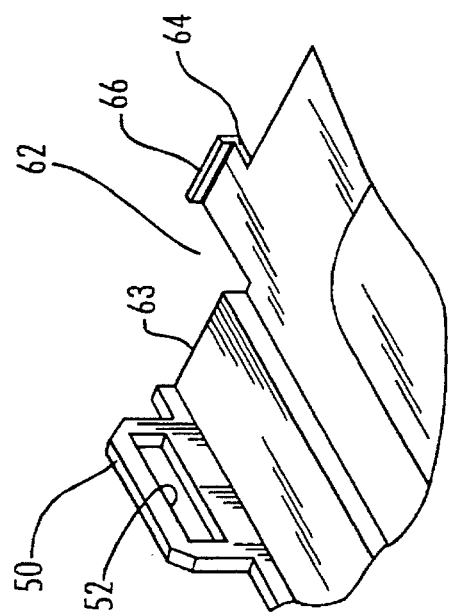
FIG. 6 is an enlarged perspective view of a rear corner of the top cover.
Figure 5:
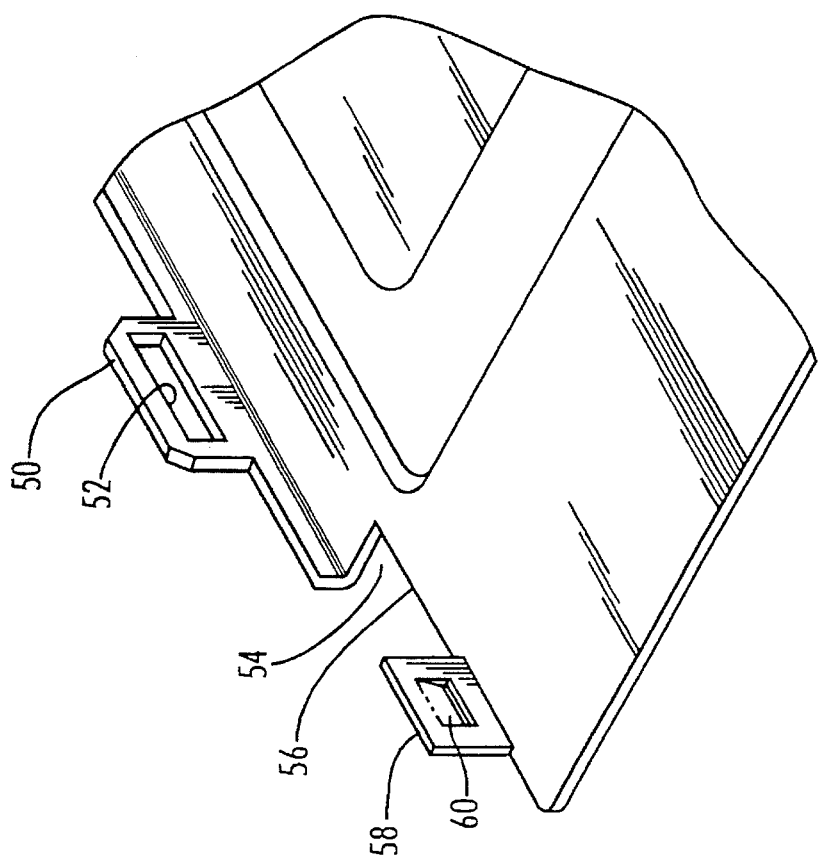
FIG. 5 is an enlarged perspective view of a forward corner of the top cover.
Figure 7:
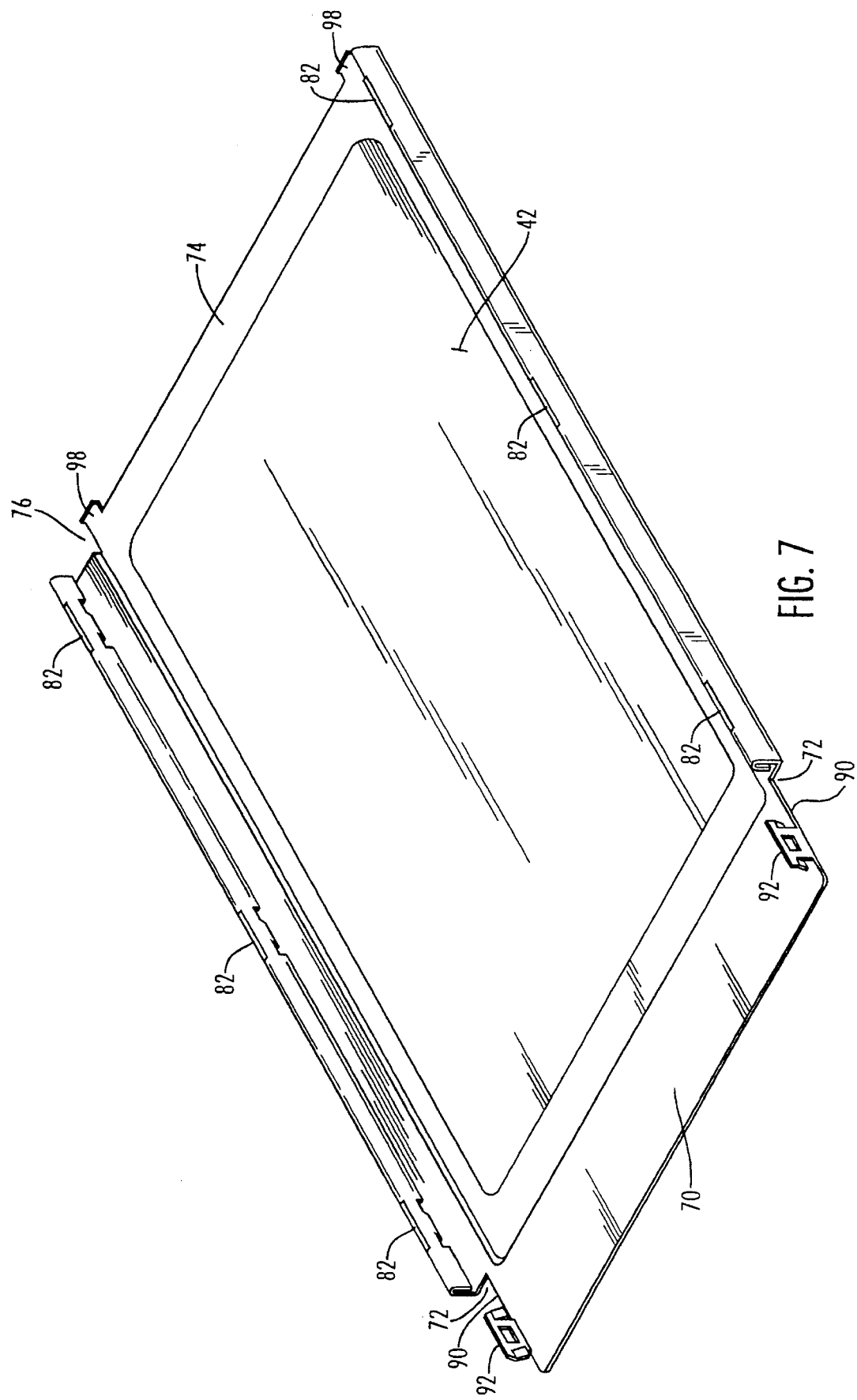
FIG. 7 is a perspective view of the bottom cover of the IC card of FIG. 1.
Figure 15:
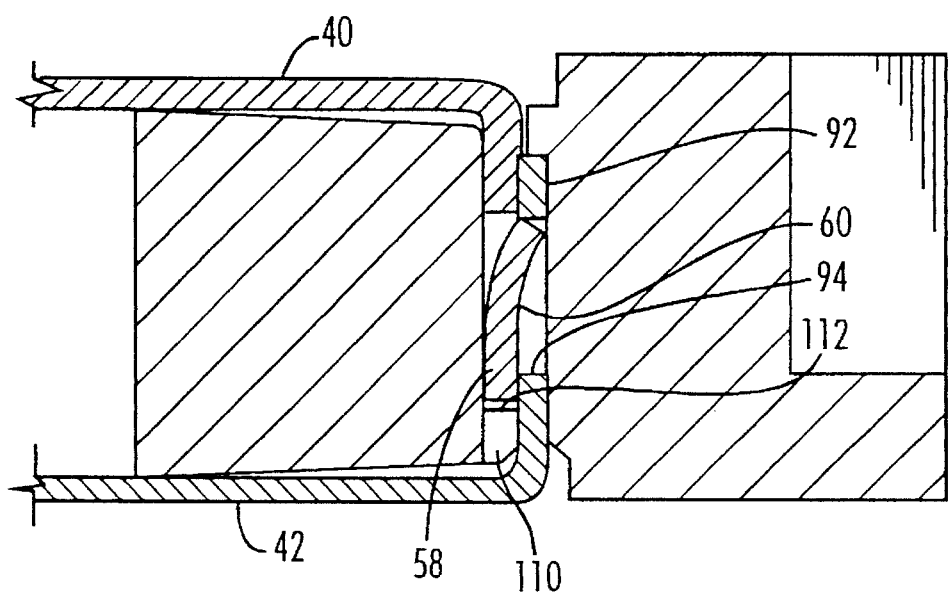
FIG. 15 is a cross section along line 15—15 in FIG. 3 showing the attachment of the bus connector to both the top and bottom covers.

The forward edge margin 44 of the top cover has corner notches 54 bordered by side edges 56 for receiving the bus connector 14 in a manner to be described. Projecting downwardly from each side edge 56 is a fastener clip 58 including a tongue-like spring 60 inclined, as shown in FIGS. 4, 5 and 15, to the main body of the clip. Like the forward margin 44 of the top cover, the rear margin 46 has corner notches 62 for receiving portions of the rear end cap 16. Each notch is defined in part by a transverse rear edge 63. Projecting rearwardly from the rear margin 46 of the top cover adjacent each corner notch 62 is a tab 64 having a downwardly bent rear edge 66.

Figure 8:
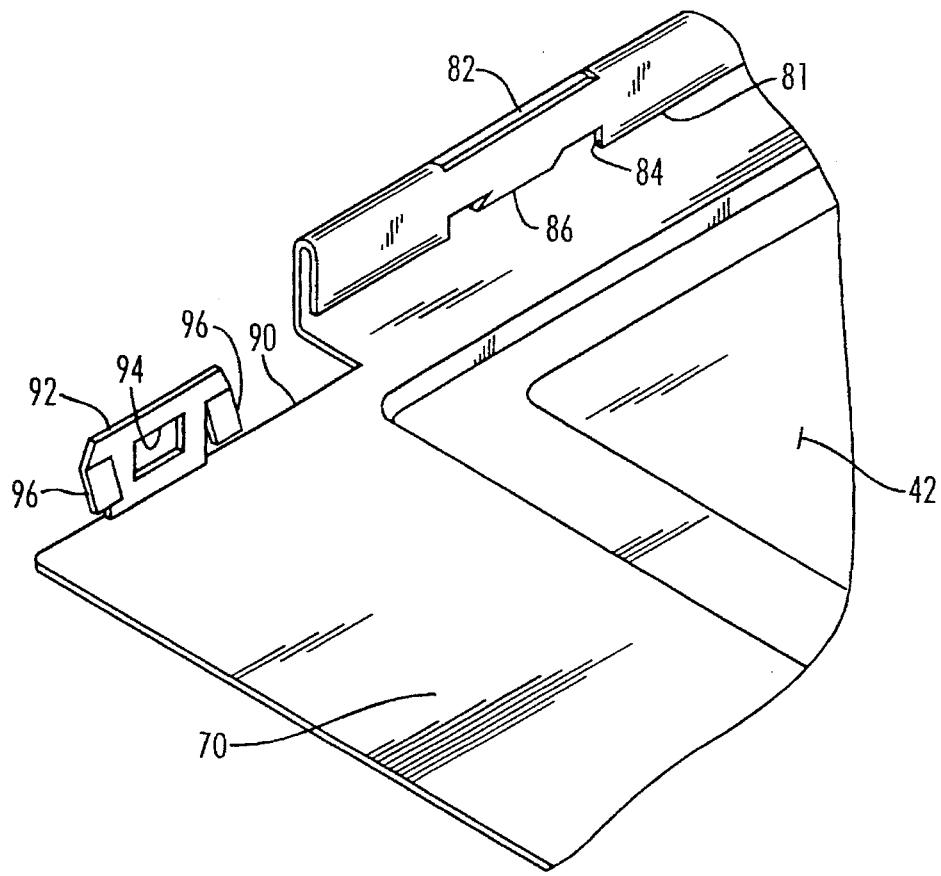
FIG. 8 is an enlarged perspective view of a forward corner of the bottom cover.
Figure 9:
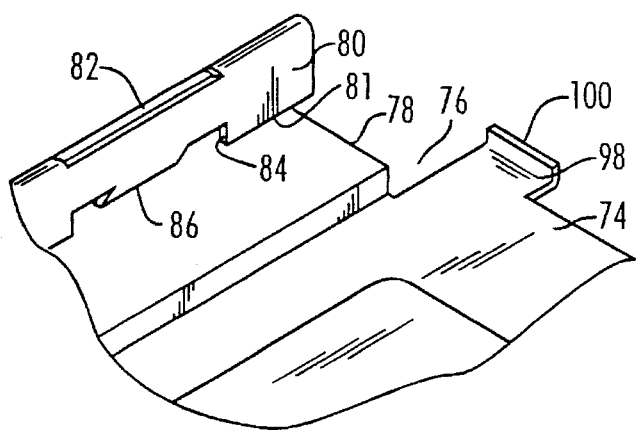
FIG. 9 is an enlarged perspective view of a rear corner of the bottom cover.
Figure 16:
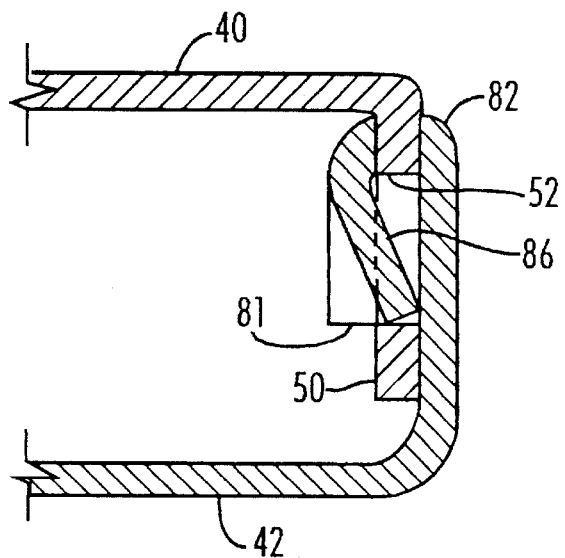
FIG. 16 is a cross section along line 16—16 in FIG. 3 showing a typical latching mechanism for interlocking the longitudinal side margins of the top and bottom covers.

The bottom cover 42, like the top cover 40, has a forward edge margin 70 with corner notches 72 and a rear edge margin 74 with corner notches 76. The notches 76 are defined in part by rear side edges 78. The bottom cover 42 further includes upstanding longitudinal side margins 80, each of which is doubled on itself to form a generally U-shaped cross section terminating in a lower longitudinal edge 81 (FIGS. 8, 9, 16 and 17). Slots 82 in alignment with the fastener tabs 50 on the top cover 40 are provided along the return bend of each of the longitudinal side margins 80. A portion 84 of the edge 81 of each of the longitudinal margins in vertical alignment with the slots 82 is notched to define tongue-like springs 86 which are bent inwardly as best seen in FIGS. 8, 9 and 16. The springs 86 are adapted to be received by the rectangular openings 52 in the tabs 50 in the top cover (FIG. 16).

Figure 14:
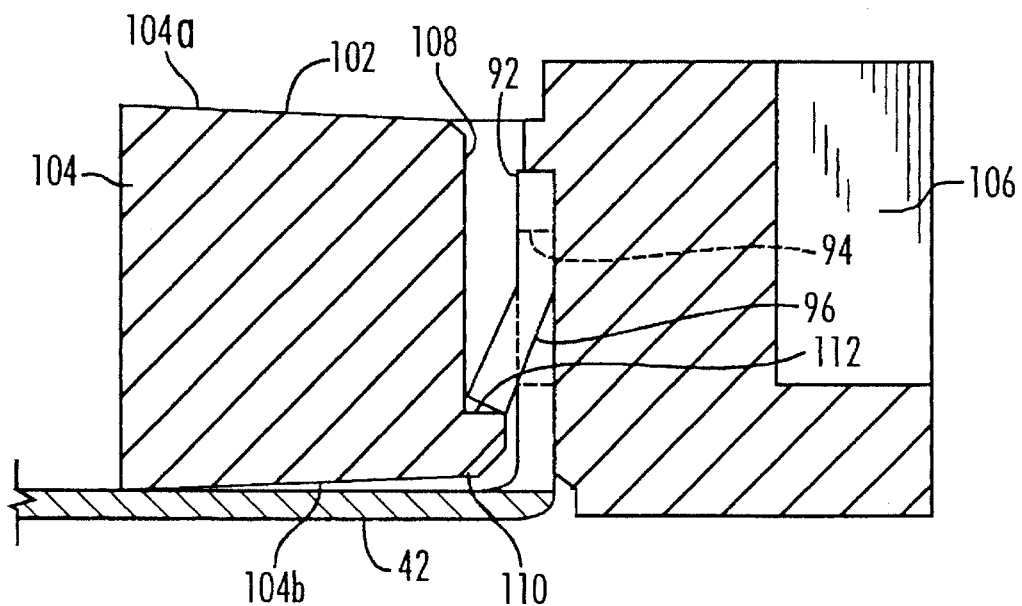
FIG. 14 is a cross section along line 14—14 in FIG. 3 showing the attachment of the bus connector to the bottom cover, with the top cover omitted for clarity.

The forward edge margin 70 of the bottom cover 42 has recessed side edges 90 and along each edge is an upstanding tab 92 generally aligned with the clip 58 on the side edge 56 of the top cover. Each tab 92 has a central rectangular opening 94 and a spring finger 96 along each of the forward and rear vertical edges of the tab 92. The spring fingers 96 are bent inwardly as shown in FIGS. 8 and 14.

Projecting from the rear edge margin 74 of the bottom cover 42 are a pair of tabs 98 identical to the tabs 64 on the top cover 40, and include rear edges 100 that are bent upwardly.

Figure 10:
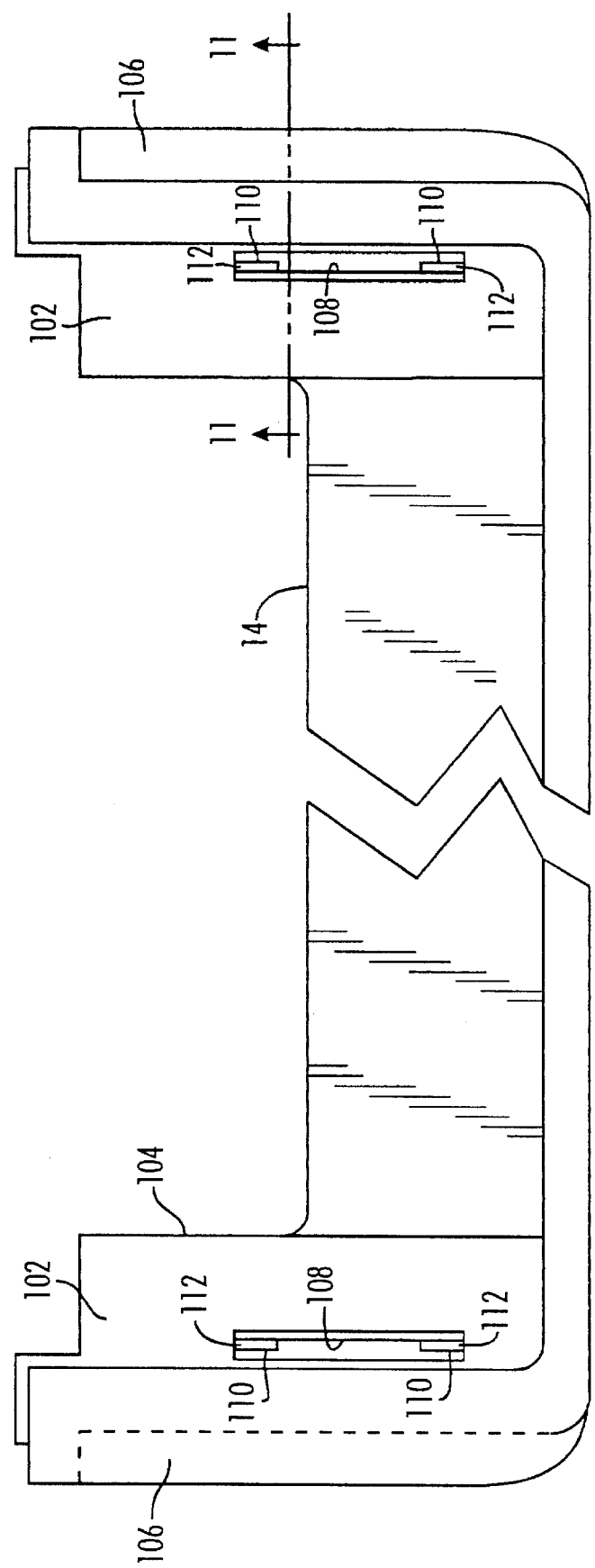
FIG. 10 is a top plan view of a bus connector forming part of the frameless IC card of FIG. 1.
Figure 11:
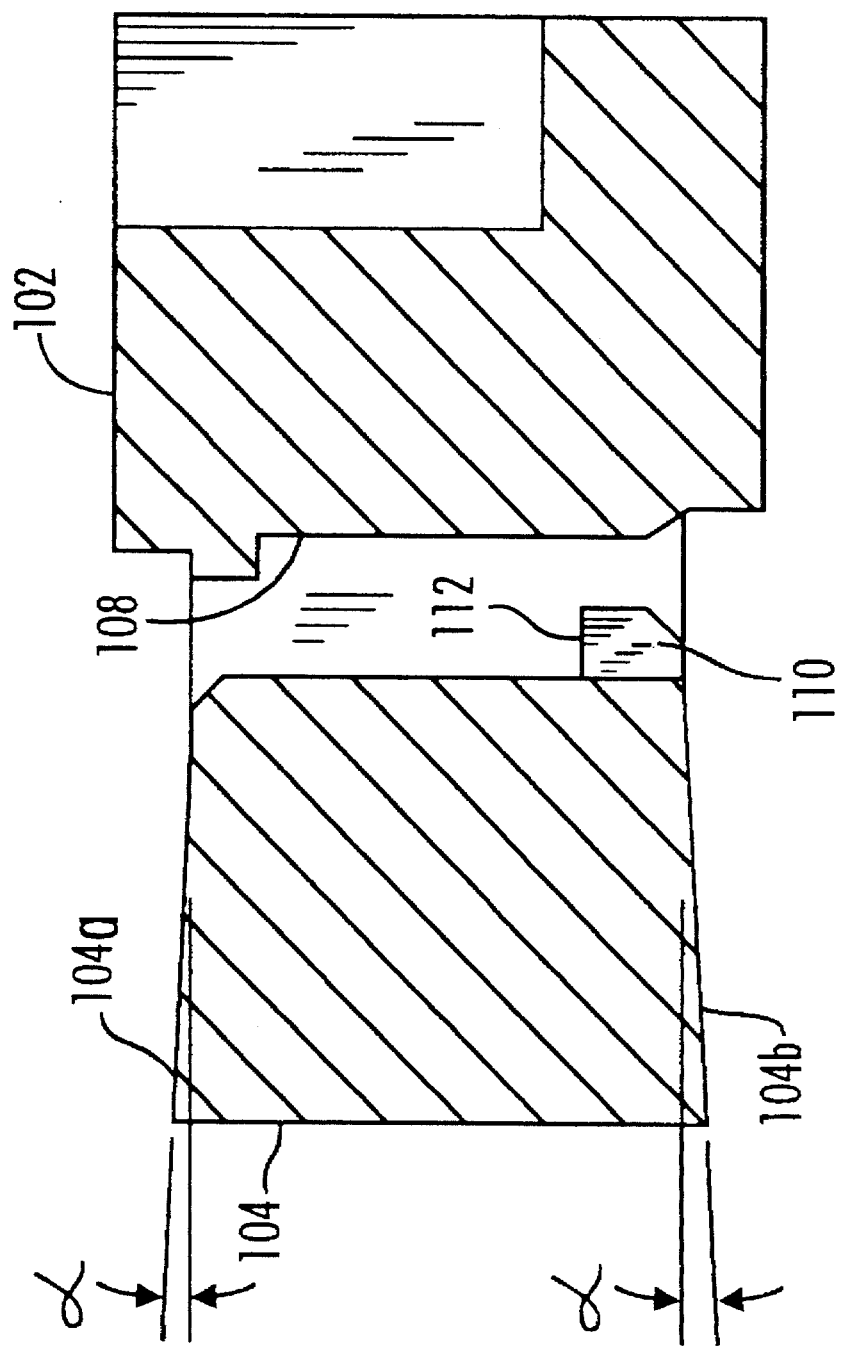
FIG. 11 is a cross section view of a portion of the bus connector of FIG. 10 as seen along section line 11—11.

With reference to FIGS. 10 and 11, the bus connector 14 in the example under consideration has a standard two row, 68-position contact configuration. The bus connector 14 includes rearwardly projecting side legs 102, each of which has an inner portion 104 adapted to fit between the top and bottom covers 40 and 42 and an outer portion 106 adapted to be received by the corner notches 62 and 76. Each leg 102 includes a longitudinally extending through-slot 108 for receiving the clip 58 and mating tab 92 on the top and bottom covers, respectfully. Projecting into the slot 108 from the inner wall thereof are longitudinally spaced apart abutments 110 having upper ledges 112 adapted to be engaged by the spring fingers 96 on the tab 92 (FIG. 14).

The inner portion 104 of the side legs 102 has upper and lower surfaces 104a and 104b, respectively. For reasons to be explained, the surfaces 104a and 104b are each disposed at a small angle α to the horizontal, as shown in FIG. 11, so that they converge toward the slot 108.

Figure 17:
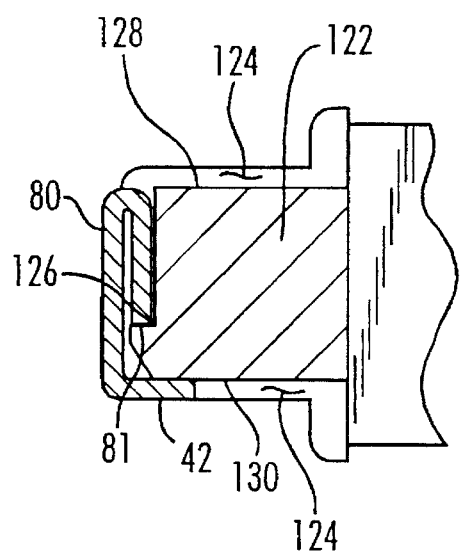
FIG. 17 is a cross section along line 17—17 in FIG. 3 showing the attachment of the rear end cap to the bottom cover, with the top cover omitted for clarity.
Figure 18:
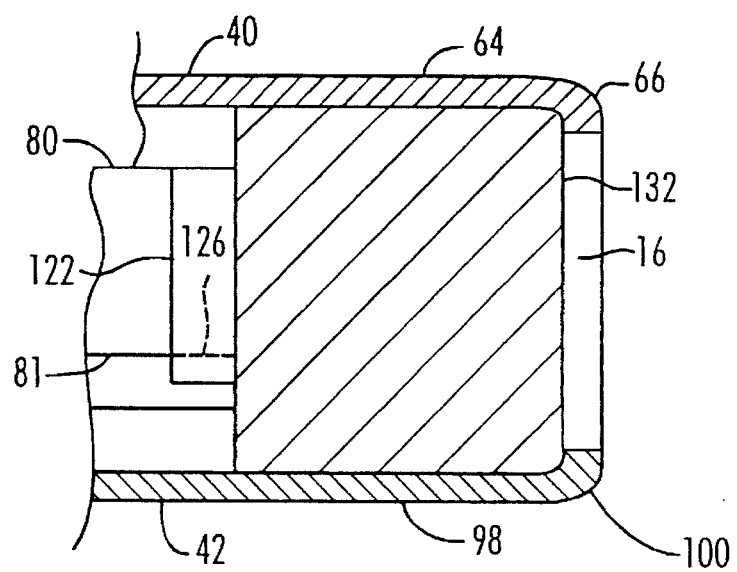
FIG. 18 is a cross section along line 18—18 in FIG. 3 showing the attachment of the rear end cap to the top and bottom covers.

The rear cap 16, which may be a molded plastic unit, includes a block 120 at each of its extremities. Each block 120 has a projection 122 extending forwardly from a front face 124 of the block. In the assembled IC card the front face 124 is engaged by the rear notch edges 63 and 78 of the top and bottom covers. The projection 122 includes a horizontal abutment surface 126 for engagement by the rear portion of the edge 81 of the longitudinal side margin 80 of the bottom cover 42 (FIG. 17). The projection 122 further includes upper and lower surfaces 128 and 130 adapted to be engaged by the portions of the inner surfaces of the top and bottom covers just forward of the notches. The rear end cap 16 is provided with a groove 132 adjacent each end block 120 for receiving the tabs 64 and 98 projecting from the rear edges of the covers (FIG. 18). It will thus be seen that in the finally assembled IC card, the rear end cap 16 is securely locked in place relative to the covers 40 and 42 in all directions.

In the case in which the bus connector 14 has single-sided PCB contact fingers 38 (rather than straddle mount contacts which are required to be soldered to opposite sides of the PCB), the housing design of the first embodiment of the present invention (FIGS. 1–18) permits the IC card to be efficiently assembled bottom up. First, the PCB 12 is inserted into the bottom cover 42, its vertical position relative to the cover being determined as necessary by appropriately dimensioned embossments or the like (not shown) on the inside surface of the bottom cover. Next, with reference to FIGS. 14 and 15, the bus connector 14 is attached to the bottom cover 42 by means of the tabs 92 which are received by the slots 108 in the bus connector. The bus connector 14 is pressed down until the spring fingers 96 of the tabs 92 engage the ledges 112 of the abutments 110 thereby securely locking the bus connector to the bottom cover. It will be seen that the angled surface 104b allows overtravel of the tabs 92. After the spring fingers 96 of the tabs 92 snap into place, cover 42 springs back to its substantially horizontal, final position (FIG. 14). The tabs 92 are preferably dimensioned so that their vertical front and rear edges contact the vertical end walls of the slots 108 thereby accurately locating and fixturing the bus connector 14 relative to the PCB 12 for reflow soldering of the bus connector contact fingers 38 to the PCB. The use of the bottom cover 42 for fixturing the bus connector 14 saves manufacturing steps and eliminates the tooling that would otherwise be needed to hold and line up the PCB connector. The rear end cap 16 is then pushed into place in the bottom cover with the projections 122 of the end blocks 120 being captured between the edges 81 of the U-shaped longitudinal side margins 80, the inner surface of the bottom cover 42 and the rear tabs 98 of the bottom cover within the rear end cap grooves 132 (FIGS. 17 and 18). Last, the top cover 40 is latched in place. In this regard, with reference to FIG. 15, it will be seen that each front clip 58 is positioned to enter the corresponding slot 108 in the bus connector 14 between the inner wall of the slot 108 and the tabs 92 of the bottom cover. The top cover 40 is pressed down until the spring finger 60 of each clip 58 snaps into the rectangular opening 94 in the associated tab 92 and latched in place. The clip 58 is sufficiently long so that in its final position it extends between the abutments 110 in the slots 108. As with the angled surface 104b, the angled surface 104a permits overtravel of the clips 58 as the top cover is pushed down, so as to assure that proper latching occurs. Pressing the top cover 40 down into its final position (FIG. 16) also latches the side fastener clips 50 and corresponding receiving tabs 86. It will be appreciated that latching of the tabs 86 and clip fasteners 50 prevent separation of the covers 40 and 42 once the IC card is assembled.

Figure 19:
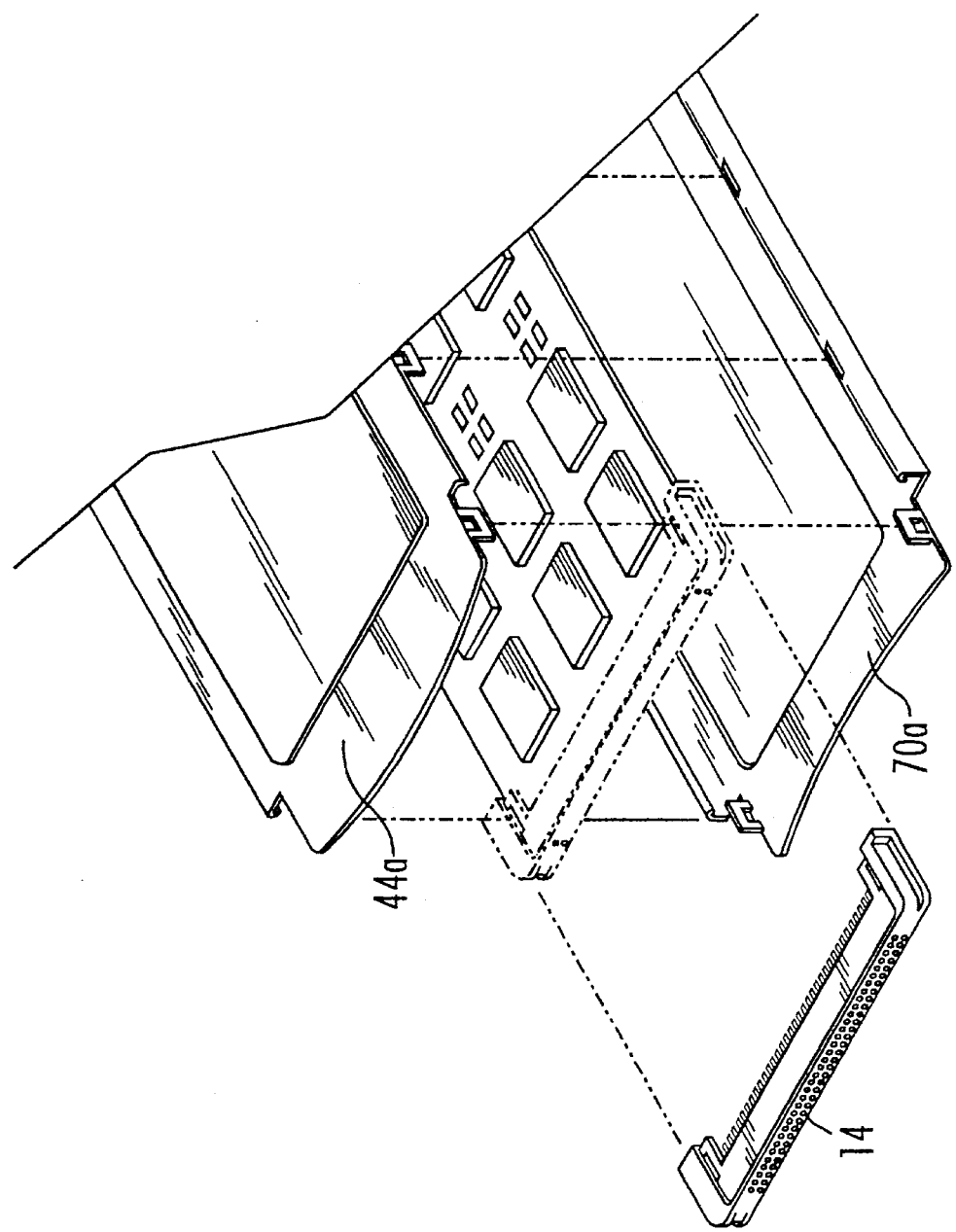
FIG. 19 is an exploded, perspective view of a portion of a frameless IC card in accordance with a second embodiment of the invention.

With reference to FIG. 19, there is show an alternative embodiment of the invention providing a more secure assembly. In this embodiment, the forward margins 44a and 70a of each cover may be provided with a slight concave bow. The frameless IC card embodiment of FIG. 19 may also be fabricated in a "bottom up" sequence, as already described. When the covers of this embodiment are latched in place, the bows in the covers are removed thereby holding the covers more tightly against the bus connector 14.

It should be noted that IC card manufacturers often purchase from one supplier a "housing kit" (comprising the housing, the bus connector and the rear end piece), and from another supplier the substrate or PCB. The housing kit components and the substrate are then assembled into the final IC card as explained herein.

Figure 20:
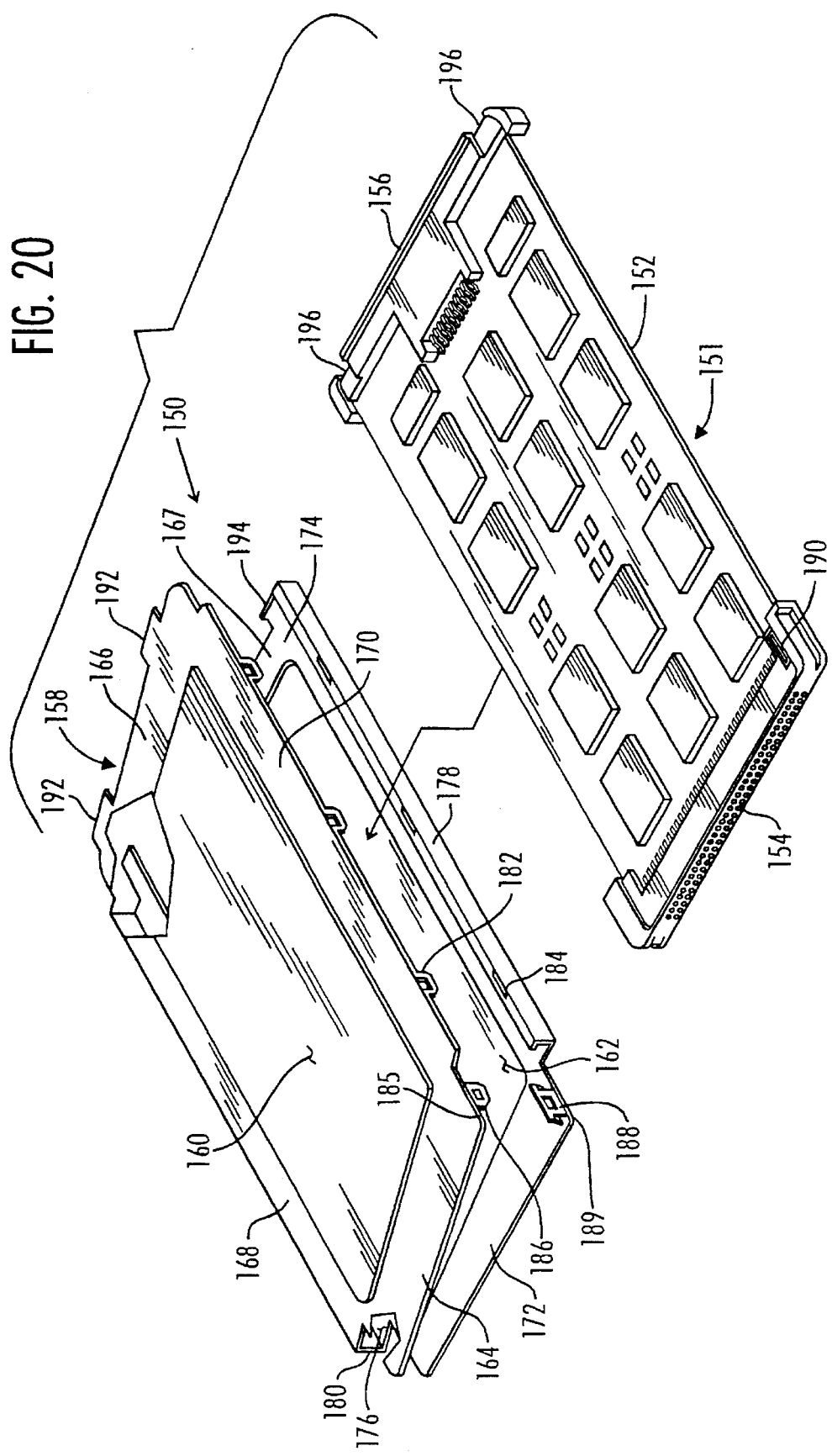
FIG. 20 is an exploded perspective view of a frameless IC card in accordance with a third embodiment of the invention.

FIG. 20 shows an alternative embodiment of the frameless IC card of the present invention in which the IC card, instead of having a two piece housing construction, includes a clam shell housing formed from a single piece of sheet metal. More specifically, FIG. 20 shows a frameless IC card 150 comprising generally a subassembly 151 comprising the combination of a substrate in the form of a PCB 152, a multipole bus connector 154 positioned along a forward edge of the PCB 152, and a rear end piece which may be in the form of an input/output connector 156 positioned along a rear edge of the PCB 152. The IC card 150 further includes a housing 158 for enclosing the PCB 152. In this embodiment, the connectors 154 and 156 are preassembled to the PCB 152 using fixturing and reflow soldering techniques known in the art. The subassembly 151 comprising the PCB 152 and attached connectors 154 and 156 is thereafter installed in the cover 158 as will be described.

The single piece housing 158 comprises an upper cover 160 and a lower cover 162. The upper cover 160 has parallel, transverse forward and rear margins 164 and 166, respectively, and parallel longitudinally extending side margins 168 and 170. The lower cover 162 has margins corresponding to those on the upper cover 160, namely, transverse forward and rear margins 172 and 174, respectively, and longitudinally extending side margins 176 and 178. The side margin 168 of the upper cover 160 and the side margin 176 of the lower cover 162 are joined by a bridging member 180, the covers 160 and 162 and the bridging member 180 comprising an integral housing structure formed from a single piece of sheet metal folded along the edges of the corresponding side margins 168 and 176 so as to place the covers and their margins in confronting, substantially aligned relationship.

Projecting vertically from the edge of the side margin 170 of the upper cover are a plurality (three in the example shown) of fastener tabs 182 which may be similar to the tabs 50 already described in connection with the first embodiment. The longitudinal side margin 178 of the lower cover 162 is configured similarly to the side margins 80 previously described, that is, comprising an upstanding, generally U-shaped element having slots 184 in alignment with the tabs 182 and tongue-like springs (not shown in FIG. 20) for receiving the tabs in interlockable, latchable fashion all as already described in connection with the previous embodiment.

The forward margin 164 of the upper cover 160 has a side edge 185 remote from the bridging member 180. The side edge 185 includes a projecting fastener clip 186 (similar to the clip 58) adapted to interlock in latching fashion with a corresponding tab 188 (similar to the tab 92) projecting upwardly from a side edge 189 of the forward margin 172 of the lower cover 162. The interlocking clip and tab pair 186/188 is adapted to be received by a longitudinal slot 190 in the bus connector 154, the slot 190 having an interior configuration as already described in connection with FIGS. 10, 11, 14 and 15. This attachment technique firmly secures the bus connector in place relative to the housing covers so that repeated insertion and withdrawal of the IC card will not damage the connector due to relative motion between the connector and fastener elements.

In the embodiment of FIG. 20, the rear edges of the corresponding rear margins 166 and 167 may be provided with pairs of rearwardly projecting, bent retainer tabs 192 and 194, respectively, like the tabs 64 and 98 in the first embodiment (FIGS. 3, 4, 6, 7 and 9). Each retainer tab set 192/194 is adapted to be received by a groove 196 formed in each outer end portion of the input/output connector 156 as already described in connection with FIGS. 12, 13 and 18.

The IC card of FIG. 20 is assembled by opening the clam shell housing sufficiently to permit insertion of the PCB subassembly 151 between the housing covers 160 and 162. The bus connector 154 is then pressed down and latched onto the fastener element 188 which is received by the slot 190 in the bus connector. The upper cover is then swung down to move the tabs 182 into the slots 184 and pressed down sufficiently to latch the fastener elements along the longitudinal side margins 170 and 178. With the upper cover so snapped in place the assembly is complete.

FIGS. 21–25 show yet another embodiment of the frameless IC card of the present invention. The IC card 200 of this embodiment includes a housing 202 comprising an upper cover 204 and a lower cover 206. The upper cover 204 includes longitudinally extending side margins 208 each of which has a generally J-shaped cross section as best seen in FIG. 22. Thus, each upper cover side margin 208 includes a downwardly directed web 210 and an inwardly directed flange 212. The lower cover 206 includes a main, generally horizontal wall 214 and generally U-shaped longitudinally extending side margins 216 each comprising a vertical side wall 218 and inwardly directed, horizontal flange 220. The main wall 214 and flange 220 are parallel and define between them a longitudinal channel 222 extending the entire length of the lower cover.

Figure 23:
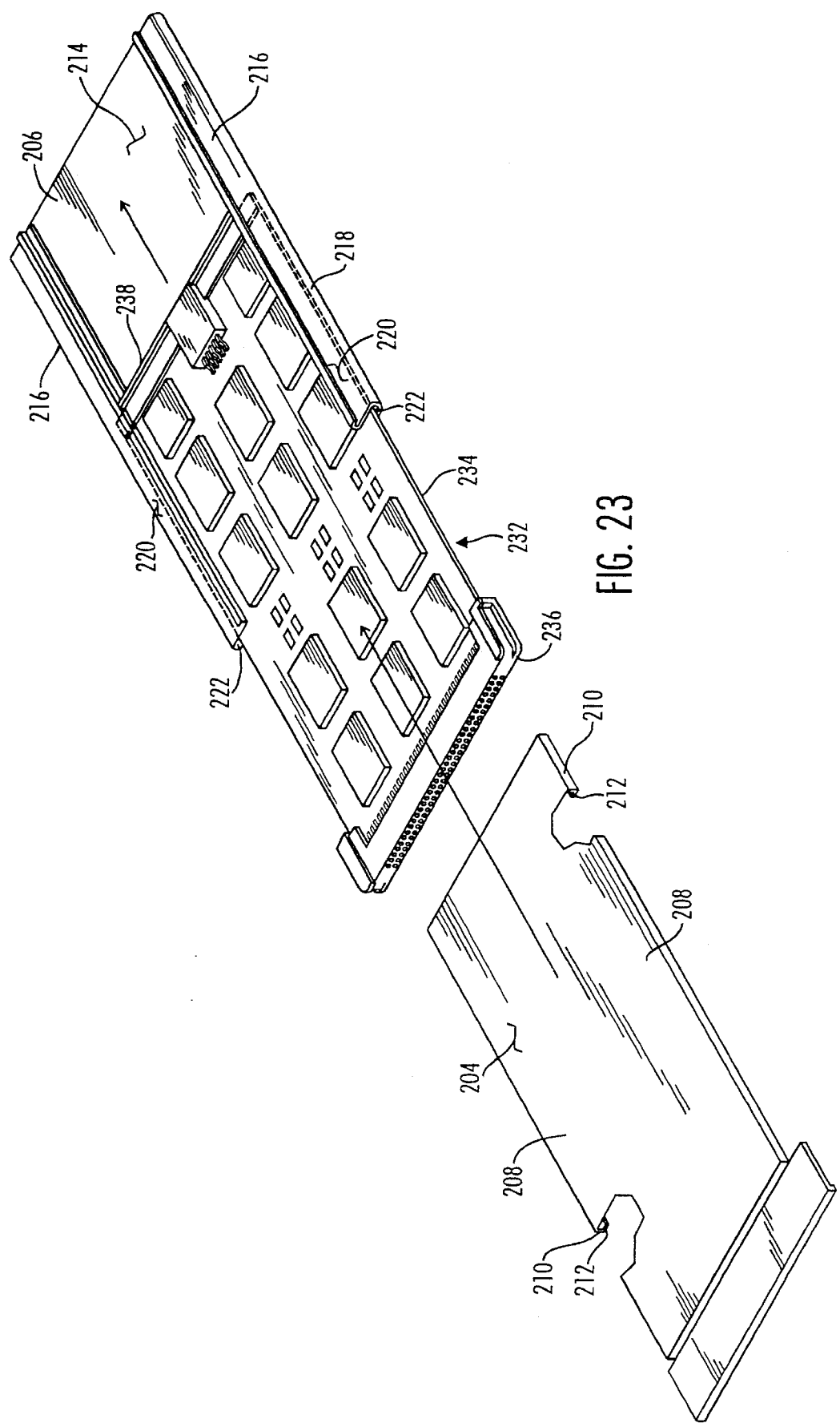
FIG. 23 is an exploded perspective view of the fourth embodiment of the invention.
Figure 24:
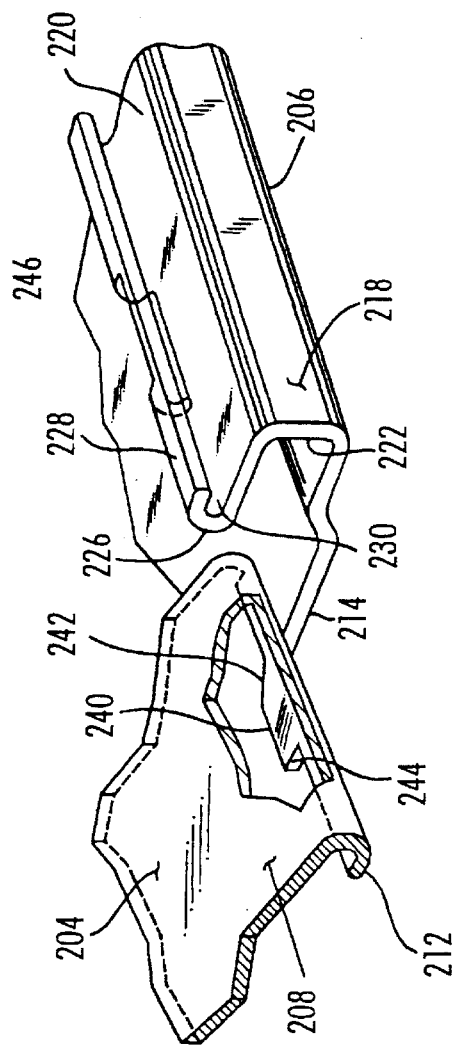
FIG. 24 is a perspective view of a portion of the fourth embodiment of the invention showing details of a cover locking mechanism.
Figure 25:
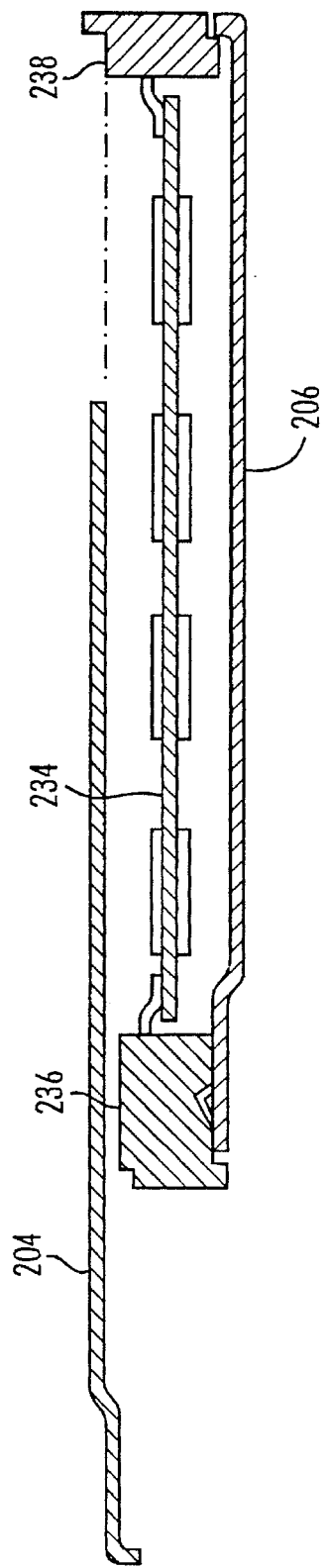
FIG. 25 is side elevation view, in schematic form, of the fourth embodiment of the invention, showing the relationships between the various major components during assembly of the IC card.

Each flange 220 has an inner edge portion 224 having a shape similar and complimentary to that of the longitudinal side margins of the upper cover 204. Thus, each edge portion 224 has an upwardly directed web 226 terminating at an outwardly directed horizontal flange 228. The horizontal flanges 220 and 228 define between them a longitudinal groove 230 extending the entire length of the lower cover for receiving, in longitudinally slidable fashion, the corresponding inwardly directed flange 212 on the upper cover. As seen in FIG. 23, a preassembled PCB subassembly 232 comprising a PCB 234, a bus connector 236 attached along the forward edge of the PCB 234 and a rear end I/O connector 238 attached along the rear edge of the PCB is slid into the opposed longitudinal channels 222 until the bus connector ends abut against the outer portions of the forward edge of the lower cover 206. As shown in FIGS. 23, 24 and 25, the flanges 212 of the upper cover 204 are then inserted into the opposed grooves 230 in the lower cover and the upper cover is slid rearwardly to its final position in which the upper cover 204 is locked in place relative to the lower cover 206. For this purpose, as shown in FIG. 24, the inner edge of each flange 212 on the upper cover is provided along its length (preferably near the forward extremity of the flange 212), with an inwardly directed, horizontal locking projection 240 having a leading, ramped edge 242 and a transverse trailing edge 244. An aperture 246 formed in the web 226 is positioned to receive the locking projection 240 in the final position of the upper housing cover 204, removal or retraction of the upper cover 204 being prevented by the trailing edge 244 engaging the forward edge of the aperture 246.

In conventional IC card assembly, it is usual to have both the bus connector and the I/O connector (when used) soldered to the circuit board prior to assembly into a card frame. A fixturing means for exact manual positioning is employed prior to soldering to establish the desired dimension between the connectors so that they will register with mating features on the frame. Clearances allow both connectors to nest in their frame slots without stressing the connector solder joints when the bus to I/O connector dimensions are within established tolerance.

In the present invention, the bus connector, which may be pre-assembled to the PCB along with the I/O connector, is locked to one cover, necessitating that all tolerances between both connectors be accommodated by allowing some degree of longitudinal freedom or "float" in the I/O connector mounting features. In the embodiments in which a cover serves to fixture both connectors for soldering, a non-rigid mounting scheme for at least one connector is still desirable. This is because heating the assembly to solder reflow temperature causes unequal expansion of metal cover relative to the circuit board due to thermal coefficient of expansion mismatch. As the assembly begins to cool after reflow, solder joint solidification occurs while the cover is still expanded to the connectorized substrate. If "float" were not provided, connector solder joints would be stressed as the cover continued to cool and contract, forcing both connectors inward, against the opposition of the solder joints. More specifically, in the embodiments of FIGS. 1–19 in which the rear end pieces is an I/O connector 24, by appropriately dimensioning the blocks 120 and grooves 132 of the I/O connector (See FIGS. 12, 13 and 18), the I/O connector 24 can be provided with a small amount of longitudinal "float" for the purposes described above.

In the embodiment of FIG. 20, the interlockable clip and tab sets (192/194) of the input/output connector 156 may be dimensioned relative to the slots 196 which receive them so as to provide sufficient clearance in the longitudinal direction to accommodate any slight differences in the lengths of the PCB subassembly in the covers so that no stress is placed on the PCB subassembly when it is in place within the cover of the IC card.

Although the bus connector could also be provided with "float", is preferable to limit this ability to the I/O connector. This is because the bus connector is typically subjected to the greatest number of mate cycles and highest insertion forces. Movement of the latching tabs within the bus connector could result in cutting or scoring the insulator. Further, allowing movement of the bus connector, if mounted to the cover prior to soldering, could result in mis-registration between PCB solder pads and solder tails. Since bus connector solder joints are subject to the most stress due to greater insertion frequency, force and insulator length, solder fillet integrity of the bus connector received priority over the I/O connector.

It will be appreciated that the IC card construction of the present eliminates the need for adhesive bond of the covers, the bus connector and the rear end piece. However, if desired, such adhesives can be used to supplement the fastening techniques disclosed herein.

It will also be understood by those skilled in the art that a ground spring (not shown) will typically be provided on the inside surface of the housing which, in the assembled configuration of the IC card, contacts a ground trace or terminal on the PCB. In present IC cards employing plastic frames, the covers are typically electrically isolated from each other by the intervening plastic frame so that a ground contact is required for each of the covers. Because in the present invention the covers are in metal-to-metal contact with each other by virtue of the described interlocking features, only one ground spring associated with one of the covers is required.

While the present invention has been described with reference to particular illustrative embodiments, the invention is not intended to be restricted to those embodiments but only by the appended claims. It will be appreciated that those skilled in the art can change or modify the described embodiments without departing from the scope and spirit of the invention.

What is claimed is:

1. A frameless IC card adapted to be removably connected to an electronic host system such as a computer or computer peripheral, the IC card comprising:

a substrate carrying electronic circuit elements and including a transverse forward edge having a plurality of contacts connected to the electronic circuit elements;

a transversely extending bus connector disposed adjacent the forward edge of the substrate and having a plurality of contact members electrically coupled to the plurality of substrate contacts, the connector being adapted to connect the electronic circuit elements on the substrate to the host system; and a housing enclosing the substrate, the housing including opposed top and bottom, substantially parallel covers having corresponding transverse forward and rear margins and longitudinal side margins, the corresponding longitudinal side margins along at least one side of the top and bottom covers being configured to interlock with each other.

2. A frameless IC card, as defined in claim 1, in which:

the corresponding longitudinal side margins along one side being secured to each other by interlocking fasteners and the corresponding longitudinal side margins along the other side being joined by a bridging member, the top and bottom covers and bridging member comprising an integral, single piece structure.

3. A frameless IC card, as defined in claim 1, in which:

the top and bottom having covers are separate elements and the corresponding longitudinal side margins along both sides of the top and bottom covers being configured to interlock with each other.

4. A frameless IC card, as defined in claim 3, in which:

the corresponding longitudinal side margins along both sides of the top and bottom covers are secured to each other by interlocking fasteners.

5. A frameless IC card, as defined in claim 4, in which:

the interlocking fasteners include (a) a plurality of fastener tabs spaced apart along the longitudinal edge margins of one of the covers, each tab having an opening therein and (b) a plurality of spring elements spaced apart along the longitudinal edge margins of the other of said covers in alignment with the tabs on the one cover, said spring elements being received by the openings in the corresponding tabs in interlocking relationship.

6. A frameless IC card, as defined in claim 3, in which:

the longitudinal side margins of one of said covers each define a longitudinally extending groove and the corresponding longitudinal side margins of the other of said covers each define a longitudinally extending flange, each flange being received by the groove defined in the corresponding side margin.

7. A frameless IC card, as defined in claim 1, in which:

portions of said bus connector are sandwiched between the forward margins of the opposed covers and attached thereto; and which includes:

a transversely extending rear end piece having portions sandwiched between the rear margins of the opposed covers.

8. An IC card, as defined in claim 7, in which:

the end piece is provided with grooves adjacent the extremities of the end piece; and the rear end margins of the top and bottom covers including rearwardly projecting bent tabs received by said grooves thereby retaining said end piece in place relative to the covers.

9. An IC card, as defined in claim 8, in which:

the longitudinal side margins of the other of said covers have a U-shaped configuration including a longitudinally extending edge; and the rear end piece further includes a surface engaged by the longitudinally extending edge to further hold the rear end piece securely in place relative to the other of said covers.

10. An IC card, as defined in claim 7, in which the rear end piece is in the form of an end cap.

11. An IC card, as defined in claim 7, in which the rear end piece is in the form of an I/O connector.

12. A frameless IC card, as defined in claim 1, in which:

the bus connector is provided with a pair of transversely spaced apart slots; and the forward edge margins of the covers have interlocking fasteners passing through said bus connector slots for securing the bus connector.

13. A frameless IC card, as defined in claim 12, in which:

the forward edge margins of the covers have longitudinally extending side edges, each of said edges of one of the covers having a tab with an opening and each of the side edges of the other of the covers having a clip in alignment with said tab, the clip having a spring element received by the opening in the tab in interlocking relationship.

14. A frameless IC card, as defined in claim 13, in which:

each slot in the bus connector is defined by walls having abutment means projecting into said slot, said tabs including spring fingers engaged by surfaces on said abutment for latching and holding the bus connector in place relative to said one cover.

15. A housing kit for a frameless IC card adapted to be removably connected to an electronic host system, said housing kit comprising:

a housing including a pair of covers adapted to be placed in confronting, spaced apart assembled relationship, each cover including a forward margin, a rear margin substantially parallel to said forward margin and a pair of substantially parallel side margins extending between the forward and rear margins, the forward, rear and side margins of one of the covers corresponding to the forward, rear and side margins of the other cover when said covers are in confronting relationship, the corresponding forward margins of the covers and at least one of the side margins of one of the covers and the corresponding side margin of the other cover being configured to interlock when said covers are placed in confronting assembled relationship;

a bus connector adapted to be received between the corresponding forward margins of the covers, said corresponding forward margins being further configured to interlock with the bus connector, the bus connector being thereby positioned relative to said covers when said covers are in said assembled relationship; and a rear end piece adapted to be received between the corresponding rear margins of the covers, said rear margins being configured to mate with said rear end piece and to hold said rear end piece substantially in place when the covers are in said assembled relationship.

16. A frameless IC card housing kit, as defined in claim 15, in which:

the other of said side margins of said one cover and the corresponding side margin of said other cover are hingedly connected.

17. A frameless IC card housing kit, as defined in claim 16, in which:

the housing comprises a one-piece sheet metal, clam shell-like structure in which the other of said side margins of said one cover and the corresponding side margin of said other cover are hingedly connected by a sheet metal bridge joining said corresponding side margins.

18. A frameless IC card housing kit, as defined in claim 17, in which:

the corresponding forward margins of the covers and said at least one side margin of said one cover and the corresponding side margin of the other cover carry latchable fastener elements, said fastener elements latching when said covers are placed in their assembled relationship, the bus connector being configured to receive the latchable fastener elements carried by the forward margins and to be positioned thereby relative to the covers.

19. A frameless IC card housing kit, as defined in claim 18, in which:

the rear end piece is an input/output connector, and at least one of the connectors is configured to float relative to the covers in a direction substantially parallel to the side margins.

20. A frameless IC card housing kit, as defined in claim 15, in which:

the corresponding rear margins of the covers carry latchable fastener elements, said fastener elements carried by said corresponding rear margins latching when said covers are placed in their assembled relationship, the rear end piece being configured to receive the latchable fastener elements carried by the corresponding rear margins and to be positioned thereby relative to the covers.

21. A frameless IC card housing kit, as defined in claim 15, in which:

the corresponding forward margins of the covers carry latchable fastener elements, said fastener elements latching when said covers are placed in their assembled relationship, the bus connector being configured to receive the latchable fastener elements carried by the forward margins and to be positioned thereby relative to the covers;

and in which:

the rear end piece is an input/output connector, and at least one of the connectors is configured to float relative to the latchable fastener elements adapted to receive that connector in a direction substantially parallel to the side margins.

22. A frameless IC card housing kit, as defined in claim 15, in which:

said covers are separate components and both side margins of both covers carry latchable fastener elements which latch when said covers are placed in their assembled relationship.

23. A frameless IC card housing kit, as defined in claim 22, in which:

the corresponding forward margins of the covers carry latchable fastener elements, said fastener elements latching when said covers are placed in their assembled relationship, the bus connector being configured to receive the latchable fastener elements carried by the forward margins and to be positioned thereby relative to said covers.

24. A frameless IC card housing kit, as defined in claim 15, in which:

the side margins of the covers carry interlocking fasteners including (a) a plurality of fastener tabs spaced apart along the side margins of one of the covers, each tab having an opening therein and (b) a plurality of spring elements spaced apart along the side margins of the other of said covers in alignment with the tabs on the one cover, said spring elements being receivable by the openings in the corresponding tabs in interlocking relationship.

25. A frameless IC card housing kit, as defined in claim 15, in which:

the bus connector is provided with a pair of transversely spaced apart slots; and the forward margins of the covers have interlocking fasteners adapted to pass through said bus connector slots for securing the bus connector in place and providing further interlockable connection between the top and bottom covers.

26. A frameless IC card housing kit, as defined in claim 25, in which:

the forward margins of the covers have side edges, each of said side edges of one of the covers having a tab with an opening and each of the side edges of the other of the covers having a clip in alignment with said tab, the clip having a spring element receivable by the opening in the tab in interlockable relationship.

27. A frameless IC card housing kit, as defined in claim 26, in which:

each slot in the bus connector is defined by walls having abutment means projecting into said slot, said tabs including spring fingers being engagable by surfaces on said abutment for latching and holding the bus connector in place relative to said one cover.

28. A frameless IC card housing kit, as defined in claim 15, in which:

the rear end piece is provided with grooves adjacent the extremities of the end piece; and the rear margins of the covers include rearwardly projecting bent tabs receivable by said grooves for retaining said end piece in place relative to the covers.

29. A frameless IC card housing kit, as defined in claim 28, in which:

the side margins of the other of said covers have a U-shaped configuration including a longitudinally extending edge; and the rear end piece further includes a surface engaged by the longitudinally extending edge to further hold the rear end piece securely in place relative to the other of said covers.

30. A frameless IC card housing kit, as defined in claim 15, in which the rear end piece is in the form of an end cap.

31. A frameless IC card housing kit, as defined in claim 15, in which the rear end piece is in the form of an I/O connector.

* * * * *